(12) United States Patent
Raleigh et al.

(10) Patent No.: US 6,317,065 B1
(45) Date of Patent: Nov. 13, 2001

(54) MULTIPLE A TO D CONVERTERS FOR ENHANCED DYNAMIC RANGE

(75) Inventors: Gregory G. Raleigh, El Granada; Vincent K. Jones, Redwood Shores, both of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/346,552

(22) Filed: Jul. 1, 1999

(51) Int. Cl.[7] ....................................................... H03M 1/12
(52) U.S. Cl. ............................................. 341/139; 341/155
(58) Field of Search ................................. 341/139, 141, 341/155; 370/241

(56) References Cited

U.S. PATENT DOCUMENTS

| | | | |
|---|---|---|---|
| 3,820,112 | 6/1974 | Roth | 340/899 |
| 4,652,882 * | 3/1987 | Shovlin et al. | 342/150 |
| 4,999,628 * | 3/1991 | Kabubo et al. | 341/139 |
| 5,014,059 | 5/1991 | Seckora | 341/172 |
| 5,111,202 * | 5/1992 | Rivera et al. | 341/139 |
| 5,422,643 * | 6/1995 | Chu et al. | 341/141 |
| 5,563,916 * | 10/1996 | Scarpa | 375/345 |
| 6,031,478 * | 2/2000 | Oberhammer et al. | 341/155 |
| 6,058,121 * | 5/2000 | Kim et al. | 370/480 |
| 6,100,832 * | 8/2000 | Uesugi | 341/139 |

* cited by examiner

Primary Examiner—Michael Tokar
Assistant Examiner—James H. Cho
(74) Attorney, Agent, or Firm—Ritter, Lang & Kaplan LLP

(57) ABSTRACT

Systems and methods for providing analog to digital conversion with improved dynamic range. Multiple low cost analog to digital converters may be used in parallel to provide the dynamic range of a single high resolution analog to digital converter that would otherwise be available only at very high cost. One application is an orthogonal frequency division multiplexing (OFDM) digital receiver which requires high dynamic range analog to digital conversion for accurate reception.

17 Claims, 4 Drawing Sheets

MULTIPLE A TO D CONVERTERS FOR ENHANCED DYNAMIC RANGE

BACKGROUND OF THE INVENTION

The present invention relates to the conversion of analog signals to digital signals and more particularly to increasing the dynamic range of analog to digital converters.

A large part of the utility of digital systems is due to their ability to process information derived from physical measurements. One example is a digital receiver that performs demodulation and decoding functions in digital form even though the signal incident on the receiver antenna is in fact an analog signal. Digital audio recording is another example of digital processing that ultimately depends on an analog signal input. Other examples may be found in digital television, instrumentation, hearing aids, etc.

Before digital techniques may be brought to advantage, the signal must be converted from analog form to a series of digital samples. This is the function of an analog to digital converter. A typical analog to digital (A to D or A/D) converter has a continuous analog signal input and outputs new digital samples at fixed intervals as multi-bit words. Each multi-bit word is a value representing the analog signal level at a particular time. The value of the output word typically scales linearly with the input signal level.

The highest value for the multi-bit word, e.g., all 1's, represents a maximum analog signal level measurable by the A to D converter. All 0's then represents a minimum measurable analog signal level. Because the number of bits of the A to D converter output is limited, the digital output value does not represent the analog signal level exactly even when it falls between the minimum and maximum. The error between the analog signal level represented by the actual digital output and the actual analog signal level is referred to as quantization noise. For each A to D converter design, there is a range of analog signal levels over which the converter will measure input signal level accurately. The upper limit of the range is a so called saturation value, the analog signal level corresponding to a digital output of all 1's. The lower limit of this range is defined by the quantization noise level and this level is in turn defined by the number of output bits of the A to D converter. The logarithm of the ratio of the upper and lower limits is sometimes referred to as the dynamic range. Dynamic range is closely related to the number of output bits of the converter and is an important figure of merit for a converter.

As has been mentioned, A to D conversion is important in implementing digital communication systems. Orthogonal frequency division multiplexing (OFDM) is a very useful technique in certain digital communications applications. OFDM is particularly useful in wireless communication systems where signals may take multiple paths from a transmitter to a receiver. OFDM addresses a problem known as multipath caused by differences in delay time among different paths taken from a transmitter to a receiver. The effect of multipath is that data symbols transmitted at different times overlap in their arrival time at the receiver and therefore interfere with one another.

In OFDM, the available bandwidth is divided into subchannels that are orthogonal to one another in the frequency domain. A high data rate signal is effectively transmitted as a set of parallel low data rate signals, each one being carried over a separate subchannel. By creating multiple low data rate subchannels, OFDM lengthens the period occupied by a single symbol so that dispersive effects tend to be confined within the period occupied by transmission of a single symbol, thereby reducing intersymbol interference.

An OFDM transmitter transmits a so-called burst of symbols in a plurality of subchannels simultaneously. To create the transmitted time domain signal corresponding to all of the subchannels, an inverse Fast Fourier Transform (IFFT) is applied to a series of frequency domain symbols to be simultaneously transmitted. The result is a time domain burst of symbols which may be converted to analog form for transmission via the wireless channel. On the receiver end, a received analog signal is converted to digital form by an A to D converter. The digital signal consists of successive bursts of time domain symbols. Each such time domain burst is converted to the frequency domain by use of the Fast Fourier Transform (FFT).

Ideally, the FFT result will be the successive bursts of frequency domain symbols input to the IFFT at the transmitter end. The dynamic range of the A to D converter is very important to accurate reception of the OFDM signal. Consider what happens when the analog signal input to the A to D converter causes saturation of the converter output even momentarily, e.g., for a time corresponding to only one time domain symbol. The digital value for that time domain symbol will now be an error. The error in a single time domain symbol value will however corrupt all of the values in a burst of frequency domain symbols output by the FFT. One solution might be to attenuate the analog signal level input to the A to D converter so that saturation never occurs. Now, however, low time domain symbol values and small differences between time domain symbol values may be lost due to the effects of quantization noise.

One way of providing higher dynamic range is to simply use an A to D converter with a larger number of output bits. For example, one could use a 14 bit converter instead of a 12 bit converter. Converter cost increases sharply with increased bit width of the output word. A 14 bit converter, for example, costs more than twice what a 12 bit converter does.

What is needed are systems and methods for providing A to D converters that have improved dynamic range but with reduced expense as compared to present solutions.

SUMMARY OF THE INVENTION

Systems and methods for providing A to D conversion with improved dynamic range are provided by one embodiment of the present invention. Multiple low cost analog to digital (A to D) converters may be used in parallel to provide the dynamic range of a single high resolution A to D converter that would otherwise be available only at very high cost. One application is an orthogonal frequency division multiplexing (OFDM) digital receiver which requires high dynamic range A to D conversion for accurate reception.

According to a first aspect of the present invention, a system is provided for converting an analog signal to digital samples. The system includes a first analog to digital converter receiving the analog signal and converting the analog signal to a first series of digital samples and a second analog to digital converter also receiving the analog signal and converting the analog signal to a second series of digital samples. The analog signal as received by the first analog to digital converter is attenuated compared to the analog signal as received by the second analog to digital converter. The system further includes a selector that selects from the first series of digital samples and the second series of digital samples an output series of digital samples so as to maintain the output series of digital samples within a desired magnitude range.

A further understanding of the nature and advantages of the invention herein may be realized by reference to the remaining of the portions of the specification and the attached drawings.

DESCRIPTION OF SPECIFIC EMBODIMENTS

Analog to digital conversion is important in many systems including, e.g., digital communication systems, instrumentation, digital audio recording, etc. An ideal analog to digital (A to D) converter would measure signal levels of successive samples of an analog signal and provide digital output that exactly represents the analog signal level no matter how large or how small. Real A to D converters, however, have limited dynamic range. This means that there is a maximum ratio of the largest absolute analog signal level that may be accurately measured to the lowest absolute analog signal level that may be accurately measured. The dynamic range is typically closely related to the number of output bits that the A to D converter uses to represent analog signal level.

Figure 1A:
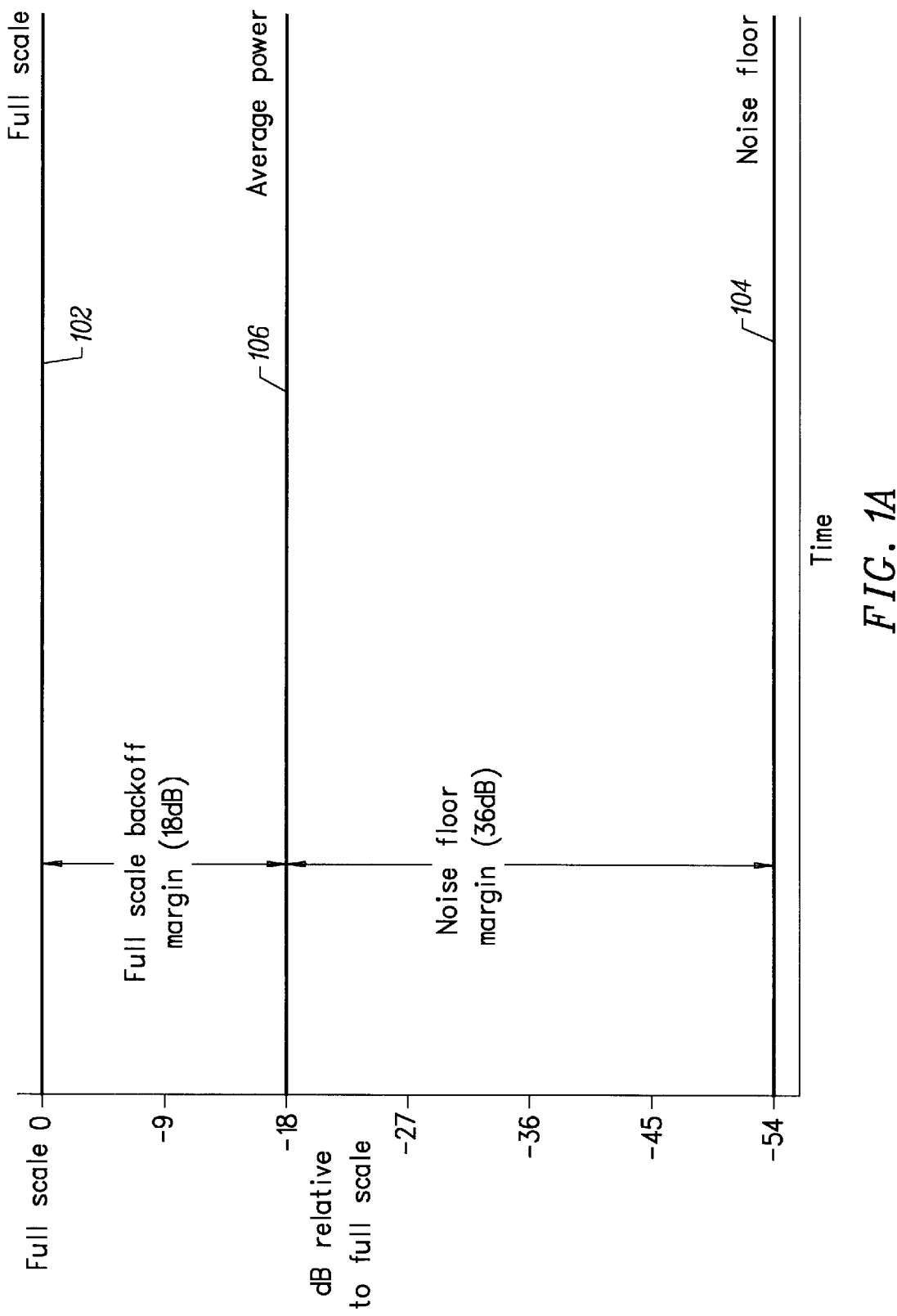
FIGS. 1A–1B depict A to D converter dynamic range requirements for accurate reception in a representative digital communications system.
Figure 1B:
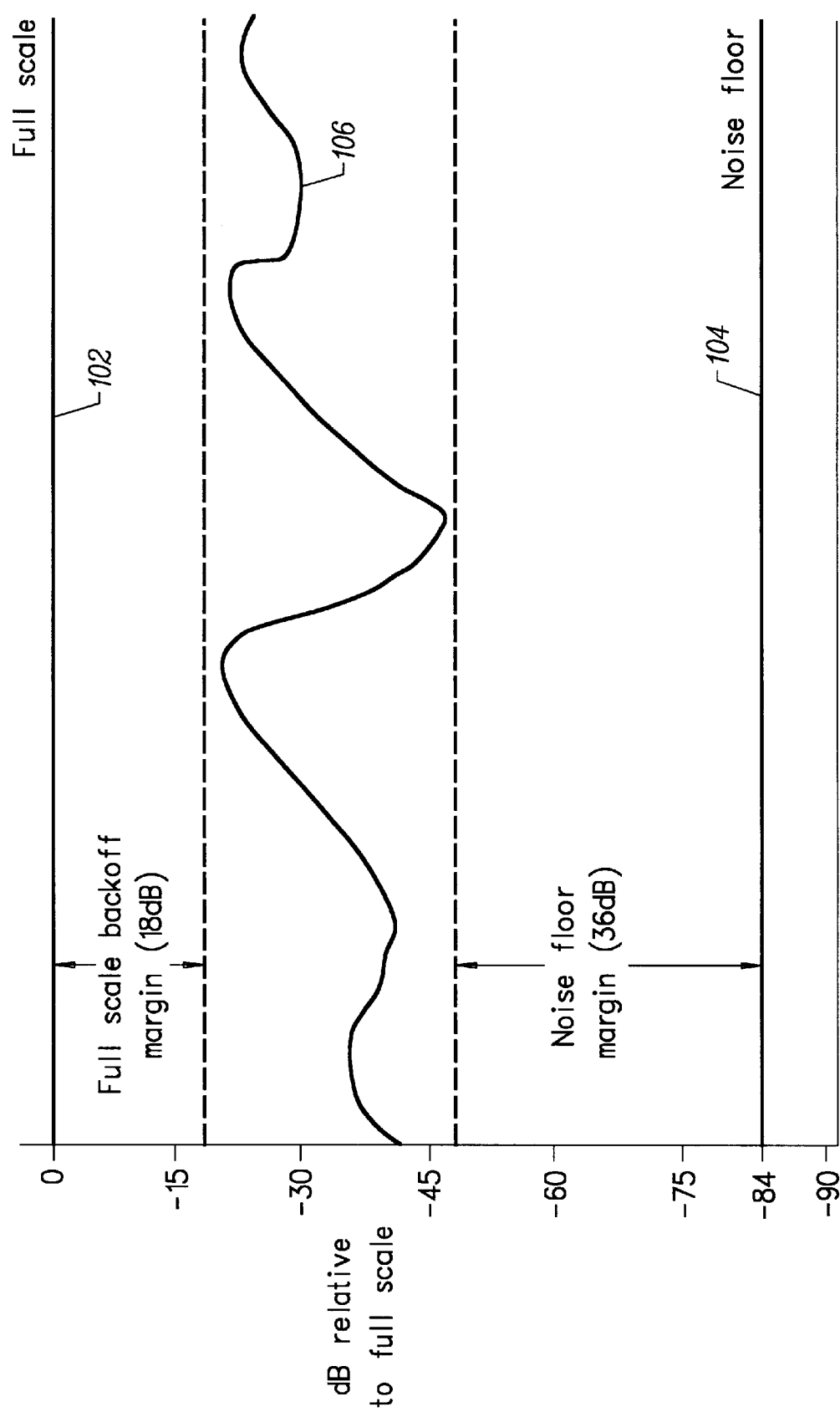

FIGS. 1A–1B depict A to D converter dynamic range requirements in representative digital communication systems. In FIGS. 1A–1B, the horizontal axis represents time. The vertical axis represents the logarithm of received analog signal power smoothed over time to represent a long term average. A horizontal line 102 represents the input analog signal level that causes a receiver's A to D converter to output the maximum digital value. This is the full scale level. A noise floor 104 represents the signal magnitude represented by the least significant bit of the digital output and also represents quantization noise caused by differences between the precise analog input signal level and the approximation indicated by the digital output.

In many applications, it is important to ensure that the A to D converter never saturates. In an OFDM communication system, inaccurate conversion of even one of a small group of samples of an analog signal may result in the corruption of a larger segment of data due to saturation of the FFT.

To prevent saturation of the instantaneous signal level, the average input signal should always be below the saturation level by a so-called "backoff margin." There should also be a noise floor margin separating the average input analog signal level from the noise floor so that the signal to quantization noise ratio is always maintained above some predetermined level. In an OFDM system, a typical desired back-off margin would be 18 dB and a typical desired noise floor margin would be 36 dB. Digital communication schemes other than OFDM may not require as large a backoff value because the signal processing system following the converter will interpret saturated outputs as indicating a maximum ideal transmitted value for the signal.

This interpretation will frequently be correct, and if it is not, corruption is limited to the saturated samples.

FIG. 1A depicts an average received signal level 106 in a communication system where there is no fading. Average received signal level 106 is therefore constant. To achieve the required backoff margin of 18 dB and the noise floor margin of 36 dB, there must be a 54 dB ratio between the full scale value and the value of the least significant bit. This is approximately the dynamic range of a 9 bit converter. The input analog signal level is attenuated or amplified to match the desired range.

FIG. 1B depicts an average received signal level 108 in a communication system where there is fading. The total gain response of the channel varies over time. Average received signal level varies over a 30 dB range. Note that the 9 bit converter would not work here, because its desired range would need to increase by 30 dB to maintain the same noise floor and saturation backoff margins. To maintain the desired margins and provide a desired range that is 30 dB wide, the converter must now have 84 dB of dynamic range corresponding to 14 bits of output. A 14 bit converter is very costly. In comparing FIG. 1A and FIG. 1B, it can be seen that required converter dynamic range is closely related to a system characteristic known as fade margin, the extent of channel response variation over time that may be tolerated without corruption to received data.

Figure 2:
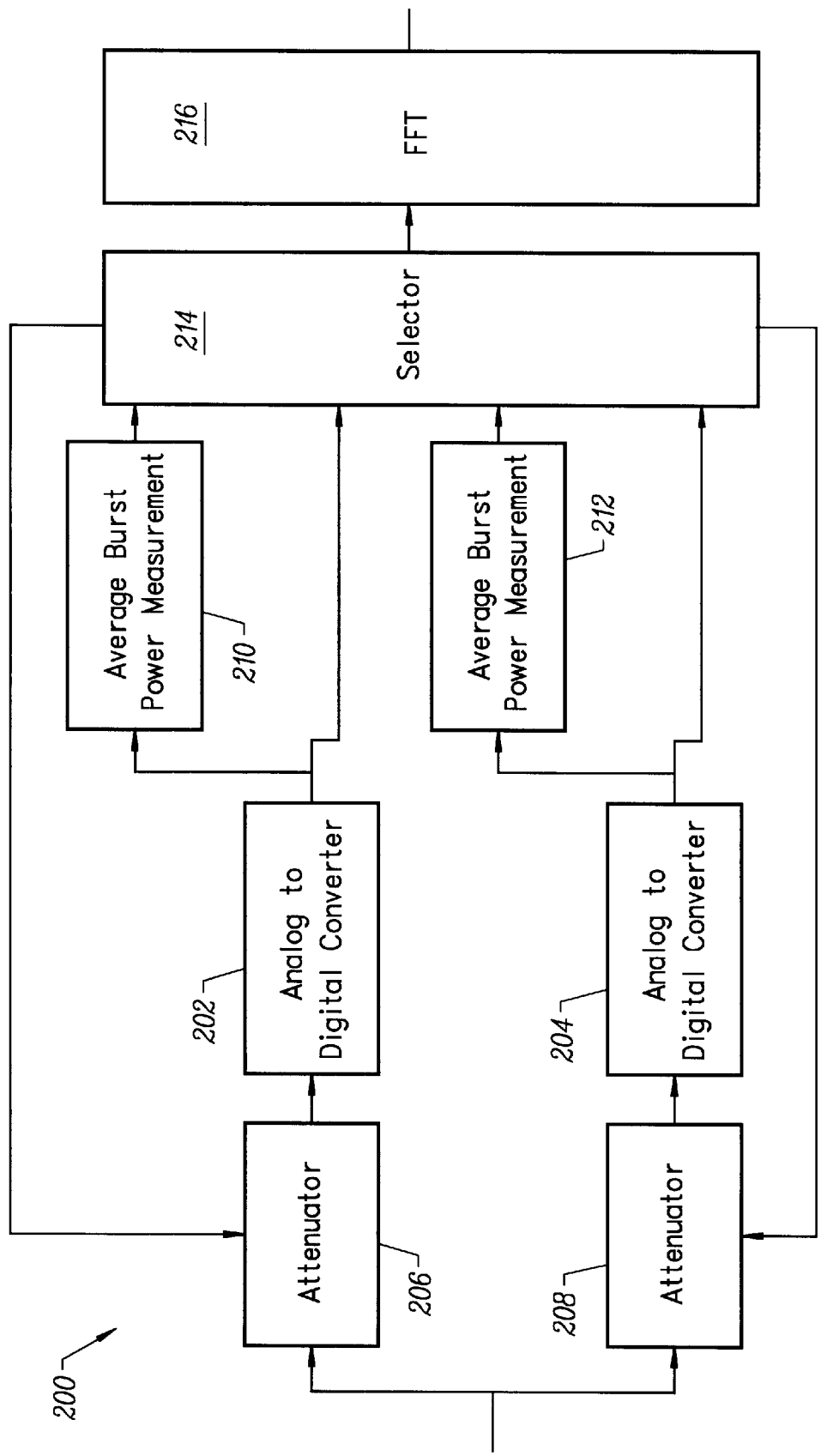
FIG. 2 depicts an A to D conversion system according to one embodiment of the present invention.

FIG. 2 depicts the use of multiple A to D converters to extend dynamic range. FIG. 2 depicts a high dynamic range A to D conversion system 200 that includes a first A to D converter 202 and a second A to D converter 204. Although only two A to D converters are depicted, the present invention also contemplates the use of three or more A to D converters.

An analog signal to be converted is fed to two attenuators, a first attenuator 206 and a second attenuator 208. The output of attenuator 206 feeds the input to A to D converter 202. Similarly, the output of attenuator 208 feeds the input to A to D converter 204. Attenuator 206 and 208 do not share the same attenuation factor but instead there is a difference in the degree to which the input signals to A to D converter 202 and A to D converter 204 are attenuated. For example, there may be a fixed attenuation difference of, e.g., 6 dB. In one embodiment, A to D converters 202 and 204 are low cost 12 bit converters. Power averagers 210 and 212 estimate average power over time for both converters, respectively. In an OFDM system where the time domain signal consists of a series of bursts, the power measurements are made on a burst by burst basis.

A selector 214 selects one of the outputs of A to D converter 202 and A to D converter 204 to be the output of A to D conversion system 200. In one embodiment, the output selection is based on the power measurements made by power averagers 210 and 212. Selector 214 selects so as to maintain the values of the selected converter within its desired range. The desired range is determined with reference to the A to D converter producing the selected output.

Figure 3:
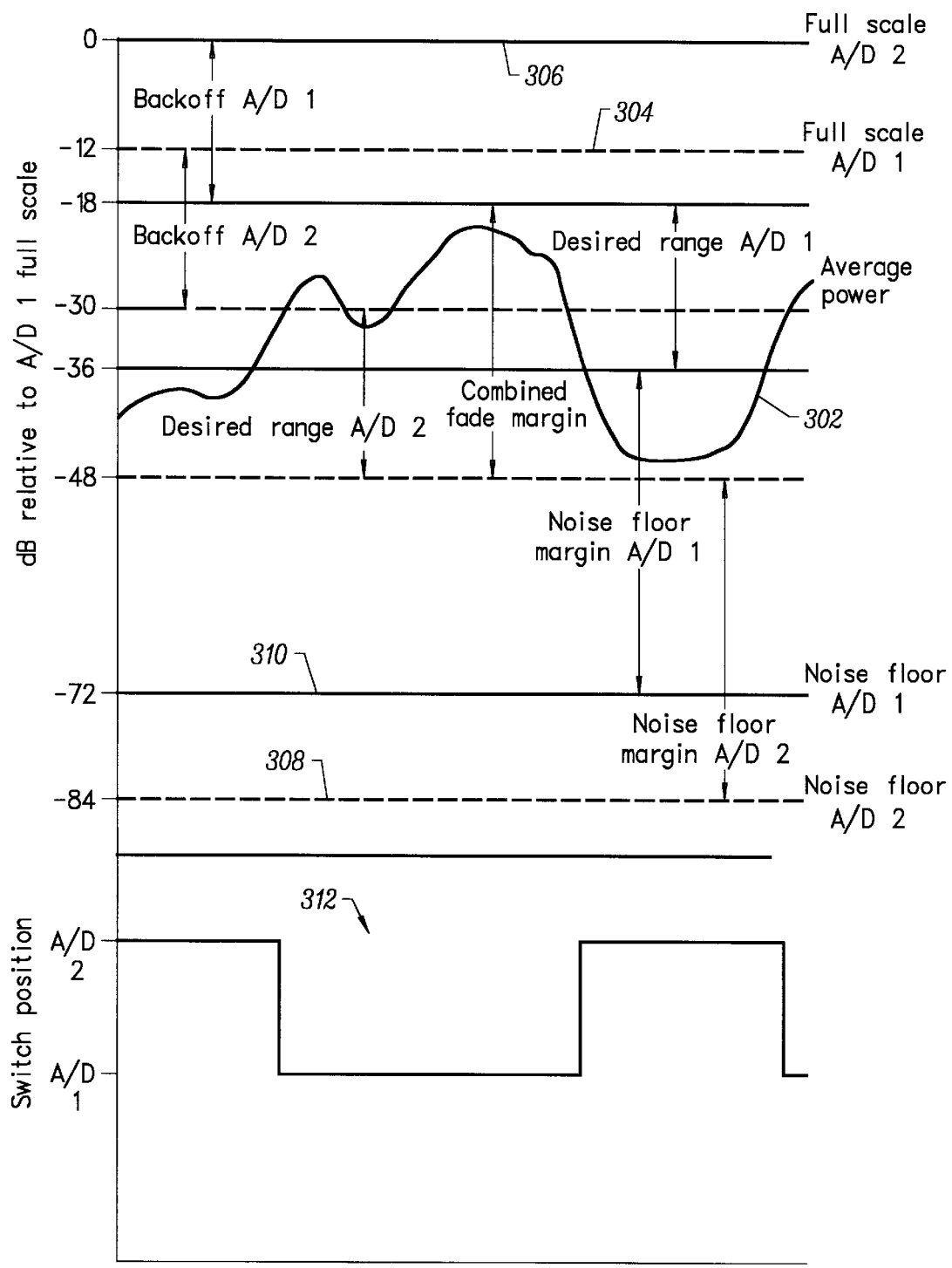
FIG. 3 depicts operation of multiple A to D converters in parallel to increase dynamic range according to one embodiment of the present invention.

The operation of selector 214 in one embodiment will be further described in reference to FIG. 3. FIG. 3 depicts an average input signal level 302 in comparison to the full scale and noise floor values of both A to D converters 202 and 204. The desired ranges are offset from one another to account for their respective input attenuations. In FIG. 3, A to D converter 204 (A/D 2) has its input attenuated by 12 dB compared to A to D converter 202 (A/D 1). The vertical axis is labeled relative to the full scale value of A to D converter 202. A full scale level 304 for A to D converter 204 is 12 dB below a full scale level 306 for A to D converter 202. The same difference exists between the noise floors 308 and 310 of the converters.

For each converter, there is a desired range of operation between 18 dB below saturation and 36 dB above the noise floor. The width of each desired range is 18 dB and there is 6 dB of overlap between the desired ranges. Selector 214 will select so that the selected A to D converter will maintain its output in its own desired range. A switch position graph 312 indicates which A to D converter is selected as average input signal level 302 varies. There is preferably hysteresis to reduce switching between converters. Selector 214 switches to A to D converter 202 as the signal rises above the desired range of A to D converter 204 and switches back to A to D converter 204 when the signal falls below the desired range of A to D converter 202.

Selector 214 applies a digital scaling factor to correct the digital output values for the relative attenuation of the selected converter. For example in the situation of FIG. 3, selector 214 amplifies the digital output of A to D converter 204 by 12 dB to account for that converter's input attenuation.

In one embodiment, power measurements for controlling selector 214 are made on successive groups of samples which may be time domain OFDM bursts. The burst rate should preferably be 100 times as great as the fading bandwidth, the 3 dB bandwidth of the average power signal.

Alternatively, selector 214 may respond to instantaneous signal levels rather than average signal levels. A selection criterion may then be to select A to D converter 204 unless a threshold frequency of saturation events is exceeded with that converter. If the threshold is exceeded, selector 214 switches to A to D converter 202. For an OFDM system, a single saturation event should be sufficient to cause selector 214 to switch to A to D converter 202.

The desired ranges depicted in FIG. 3 may be moved upward or downward based on longer term measurements of the signal, thereby providing an automatic gain control (AGC) loop. This is done by modifying the attenuation factors of attenuator 206 and attenuator 208 while maintaining the relative attenuation between them. In one embodiment, the AGC loop bandwidth is approximately one tenth of the fading bandwidth.

It will be seen that with the use of two converters and providing 12 dB in relative attenuation between the converters, the fade margin can be increased to 30 dB where each of the converters individually could provide a fade margin of only 18 dB. Effectively, the 12 bit converters when combined in this fashion can then provide the fade margin available from a single 14 bit converter. In many applications, a single 14 bit converter will cost more than the combined cost of two 12 bit converters. In general, the fade margin provided by two identical converters operating together as in FIG. 2 is the sum of the fade margins that could be provided by each one individually minus the magnitude of the overlap in the converters' desired ranges.

One application of A to D conversion system 200 is an OFDM receiver. In one embodiment, the output samples of selector 214 therefore represent successive time domain bursts in an OFDM signal. These time domain bursts may be converted to the frequency domain by a Fast Fourier Transform (FFT) block 216. FFT block 216 outputs successive bursts of frequency domain symbols. In most OFDM embodiments, a cyclic prefix will be removed from each burst of time domain symbols prior to input to FFT processing block 216.

While the above is a complete description of preferred embodiments of the invention, alternatives, modifications, and equivalents may be used. It should be evident that the invention is equally applicable by making appropriate modifications to the embodiments described above. For example, more than two A to D converters may be used in parallel. Also, amplification may be used instead of or in combination with attenuation to develop relative attenuation between the converter inputs. The present invention is not limited in application to OFDM systems or to digital communication systems. Therefore, the above description should not be taken as limiting the scope of the invention that is defined, by the metes and bounds of the appended claims along with their full scope of equivalents.

What is claimed is:

1. A system for converting an analog signal to digital samples, said system comprising:
   a first A to D converter receiving said analog signal and converting said analog signal to a first series of digital samples;
   a second A to D converter receiving said analog signal and converting said analog signal to a second series of digital samples wherein said analog signal as received by said first A to D converter is attenuated compared to said analog signal as received by said second A to D converter;
   a selector that selects from said first series of digital samples and said second series of digital samples an output series of digital samples so as to maintain said output series of digital samples within a desired magnitude range of a currently selected converter;
   an FFT block that converts successive bursts of said output series of digital samples to a frequency domain representation; and
   a power measurement system that measures average power of successive bursts within said first series of digital samples and said second series of digital samples and provides average power measurements to said selector.

2. The system of claim 1 wherein said output series of digital samples are scaled to account for relative attenuation between said first A to D converter and said second A to D converter.

3. The system of claim 2 wherein a dynamic range between a lowest level of said analog signal that will saturate a value in said output series of digital samples and a highest level of said analog signal sufficient to exceed a quantization noise floor will exceed a dynamic range of either said first A to D converter or said second A to D converter individually.

4. The system of claim 3 wherein said dynamic range of said output series of digital samples provides a communication system with enhanced fade margin.

5. The system of claim 1 wherein an attenuation difference between inputs to said first A to D converter and said second A to D converter is set to help maintain said output series of digital samples within said desired magnitude range.

6. The system of claim 1 further comprising:
   a first attenuator that attenuates said analog signal as input to said first A to D converter; and
   a second attenuator that attenuates said analog signal as input to said second A to D converter.

7. The system of claim 6 wherein an attenuation level of said first attenuator and said second attenuator is set.

8. A system for converting an analog signal to a digital signal comprising:
   a plurality of A to D converters each accepting a differently scaled representation of said analog signal, each outputting a digital series of samples;
   a selector selecting one of said digital series of samples as an output sample series to maintain values of said output sample series within a desired range;

an FFT block that converts successive bursts of said output sample series to a frequency domain representation; and a power measurement system that measures average power of successive bursts within said each of said series of digital samples and provides average power measurements to said selector.

9. The system of claim 8 wherein a dynamic range of said system exceeds a dynamic range of any of said plurality of A to D converters individually.

10. The system of claim 8 wherein a weighting factor for input to each of said plurality of A to D converters is set.

11. A method for converting an analog signal to a digital signal, said method comprising:

converting said analog signal to a first series of digital samples wherein said analog signal is scaled by a first scaling factor prior to conversion;

converting said analog signal to a second series of digital samples wherein said analog signal is scaled by a second scaling factor prior to conversion, said second scaling factor being different from said first scaling factor;

selecting from said first series of digital samples and said second series of digital samples an output series of digital samples so as to maintain said output series of digital samples within a desired magnitude range;

transforming successive bursts of said output series of digital samples to a frequency domain representation;

measuring average power of successive bursts within said first series of digital samples and second series of digital samples; and basing said selecting of said output series of samples on results of said measured average power.

12. The method of claim 11 further comprising setting an attenuation difference between inputs to said first A to D converter and said second A to D converter so as to help maintain said output series of digital samples within said desired magnitude range.

13. The method of claim 12 wherein a dynamic range between a lowest level of said analog signal that will saturate a value in said output series of digital samples and a highest level of said analog signal sufficient to exceed a quantization noise floor will exceed a dynamic range of either said first A to D converter or said second A to D converter individually.

14. The method of claim 13 further comprising setting attenuation levels for said first A to D converter and said second A to D converter so as to help maintain said output series of digital samples within said desired magnitude range.

15. The method of claim 12 further comprising:

attenuating said analog signal as input to said first A to D converter; and attenuating said analog signal as input to said second A to D converter.

16. The method of claim 11 wherein said first series of digital samples and said second series of digital samples are generated by first and second A to D converters respectively.

17. Apparatus for converting an analog signal to a digital signal, said apparatus comprising:

means for converting said analog signal to a first series of digital samples wherein said analog signal is scaled by a first scaling factor prior to conversion;

means for converting said analog signal to a second series of digital samples wherein said analog signal is scaled by a second scaling factor prior to conversion, said second scaling factor being different from said first scaling factor;

means for selecting from said first series of digital samples and said second series of digital samples an output series of digital samples so as to maintain said output series of digital samples within a desired magnitude range means for transforming successive bursts of said output series of digital samples to a frequency domain representation;

means for measuring average power of successive bursts within said first series of digital samples and second series of digital samples; and means for basing said selecting of said output series of samples on results of said measured average power.

* * * * *